US008799744B2

(12) United States Patent
Takizawa

(10) Patent No.: US 8,799,744 B2
(45) Date of Patent: Aug. 5, 2014

(54) NONVOLATILE SEMICONDUCTOR MEMORY AND MEMORY SYSTEM

(75) Inventor: Ryousuke Takizawa, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 229 days.

(21) Appl. No.: 13/423,733

(22) Filed: Mar. 19, 2012

(65) Prior Publication Data

US 2013/0024744 A1   Jan. 24, 2013

(30) Foreign Application Priority Data

Jul. 19, 2011   (JP) ................. 2011-158093

(51) Int. Cl.
*G11C 29/00* (2006.01)
*G06F 11/10* (2006.01)
*H04L 7/04* (2006.01)

(52) U.S. Cl.
CPC ............ *G06F 11/1008* (2013.01); *G06F 11/10* (2013.01); *H04L 7/048* (2013.01)
USPC ............ 714/763; 714/752; 714/800; 714/798

(58) Field of Classification Search
CPC ............ G06F 11/1076; G06F 11/1088; G06F 11/1068; G06F 2212/403; G06F 11/1044; G06F 3/0679; G06F 11/10; G11C 7/1006; H04L 7/048; H03M 13/11
USPC ......... 714/763, 758, 752, 710, 718, 765, 798, 714/800; 360/26, 36.1, 47, 53; 365/200, 365/201
See application file for complete search history.

(56) References Cited

U.S. PATENT DOCUMENTS

| 4,464,755 | A | * | 8/1984 | Stewart et al. | ................. 714/805 |
| 4,660,200 | A | * | 4/1987 | Okamoto et al. | ............. 714/755 |
| 5,142,541 | A | * | 8/1992 | Kim et al. | ...................... 714/764 |
| 5,150,210 | A | * | 9/1992 | Hoshi et al. | ............. 375/240.14 |
| 8,068,198 | B2 |  | 11/2011 | Moriyama et al. | |
| 8,091,008 | B2 | * | 1/2012 | Oku | ............................. 714/766 |
| 2004/0187065 | A1 | * | 9/2004 | Hwang et al. | ................. 714/762 |
| 2004/0237022 | A1 | * | 11/2004 | Karpuszka et al. | ........... 714/764 |
| 2008/0109700 | A1 | * | 5/2008 | Lee et al. | ...................... 714/758 |
| 2009/0119567 | A1 | * | 5/2009 | Kawabata | ..................... 714/763 |
| 2010/0064200 | A1 | * | 3/2010 | Choi et al. | ..................... 714/773 |

FOREIGN PATENT DOCUMENTS

JP   2009-192990   8/2009

* cited by examiner

*Primary Examiner* — Albert Decady
*Assistant Examiner* — Osman Alshack
(74) *Attorney, Agent, or Firm* — Knobbe, Martens, Olson & Bear LLP

(57) ABSTRACT

A nonvolatile semiconductor memory outputs the first parity flag corresponding to the error-corrected read data from the second input/output pin in synchronization with the error-corrected read data in the data buffer outputted from the first input/output pin.

20 Claims, 10 Drawing Sheets

NONVOLATILE SEMICONDUCTOR MEMORY AND MEMORY SYSTEM

CROSS-REFERENCE TO RELATED APPLICATION

This application is based upon and claims the benefit of priority from the prior Japanese Patent Application No. 2011-158093, filed on Jul. 19, 2011, the entire contents of which are incorporated herein by reference.

BACKGROUND

1. Field

Embodiments described herein relate generally to a nonvolatile semiconductor memory and a memory system.

2. Background Art

In recent years, nonvolatile large-capacity working memories capable of high-speed writing have come up with nonvolatile double data rate (DDR) interfaces. A conventional nonvolatile ROM can be replaced with such a nonvolatile large-capacity working memory alone.

Mainly used ROMs are write-once memories or memories having extremely low frequencies as in, for example, updating of firmware.

Moreover, a nonvolatile ROM is a device separated from a RAM, which achieves a robust mechanism against carelessness of a user and the operations of an operation system and an application system.

DETAILED DESCRIPTION

A nonvolatile semiconductor memory according to an embodiment includes a memory cell array having a plurality of memory cells for storing data. The nonvolatile semiconductor memory includes an ECC processing circuit that receives read data from the memory cells, the ECC processing circuit outputting, in the case where an error is detected in the read data, the error-corrected read data and a first parity flag indicating that the read data has been error-corrected, and outputting, in the case where an error is not detected in the read data, the read data without correcting the error and a second parity flag indicating that the read data has not been error-corrected. The nonvolatile semiconductor memory includes a data buffer that stores the read data and the parity flags outputted from the ECC processing circuit. The nonvolatile semiconductor memory includes a first input/output pin that outputs the read data outputted from the data buffer. The nonvolatile semiconductor memory includes a second input/output pin that outputs the first or second parity flag outputted from the data buffer.

The first parity flag corresponding to the error-corrected read data is outputted from the second input/output pin in synchronization with the error-corrected read data in the data buffer outputted from the first input/output pin.

Hereafter, a nonvolatile semiconductor memory and a memory system according to the present invention will be described more specifically with reference to the drawings.

COMPARATIVE EXAMPLE

Figure 1:
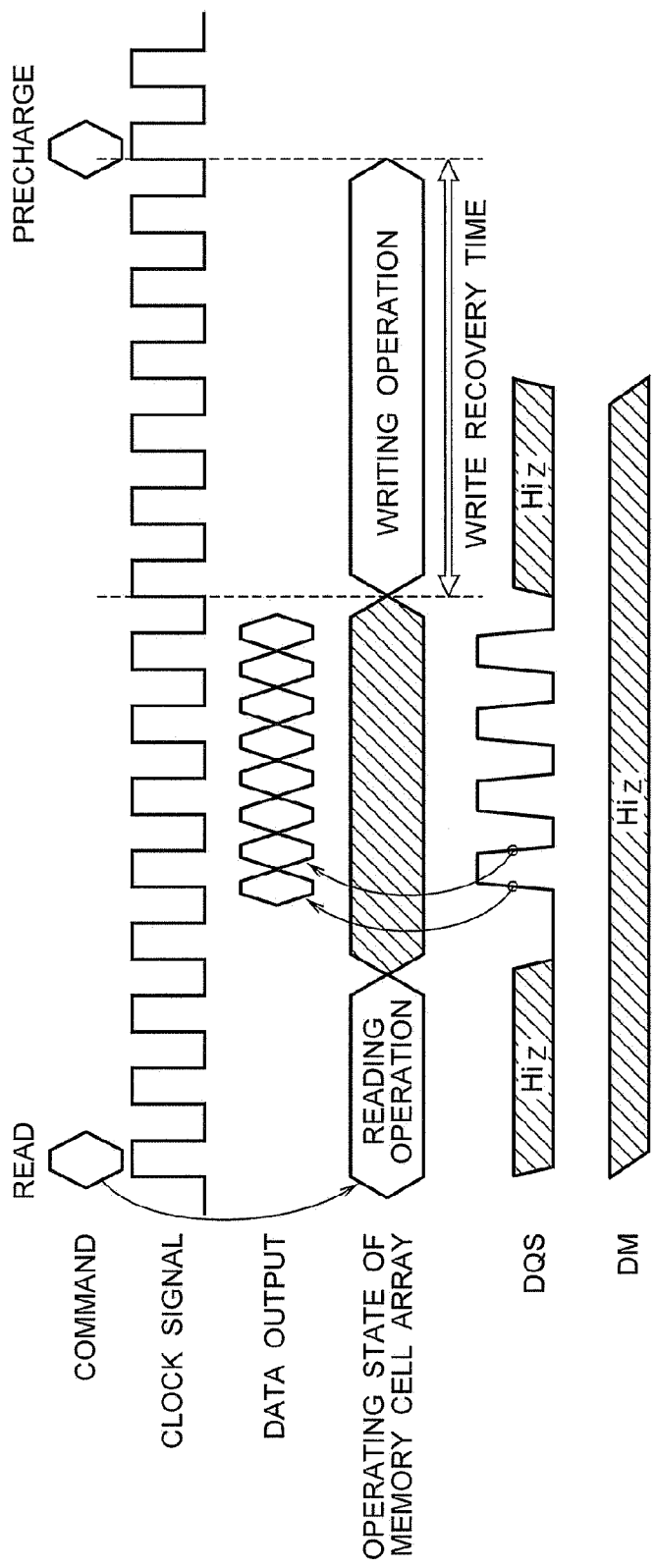
FIG. 1 is a waveform chart showing a comparative example of access timing during reading in the case where on-chip ECC is enabled in a DDR interface.

FIG. 1 is a waveform chart showing a comparative example of access timing during reading in the case where on-chip ECC is enabled in a DDR interface.

As shown in FIG. 1, in the comparative example, a memory cell array is read in response to a read command and then read data is outputted in response to a data strobe signal DQS inputted from the outside.

Moreover, a write recovery time is set for writing back the read data corrected by an ECC processing circuit, into the memory cell array regardless of the presence or absence of an error in the read data.

Thus, in the comparative example, it is necessary to wait for the passage of the write recovery time even if no error has been found, leading to degradation of random access performance.

In the following embodiments, a proposed nonvolatile semiconductor memory can improve access performance with an ECC protection function. Moreover, an error to be recovered is a soft error in the following embodiments.

The embodiments will be described below with reference to the accompanying drawings.

(First Embodiment)

Figure 2:
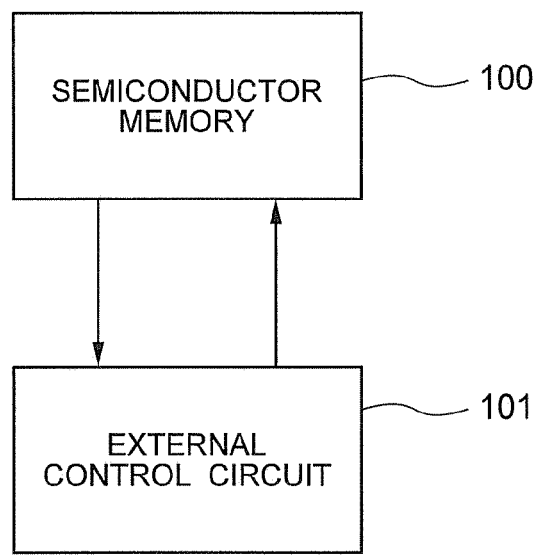
FIG. 2 illustrates an example of the configuration of a memory system 1000 according to a first embodiment.
Figure 3:
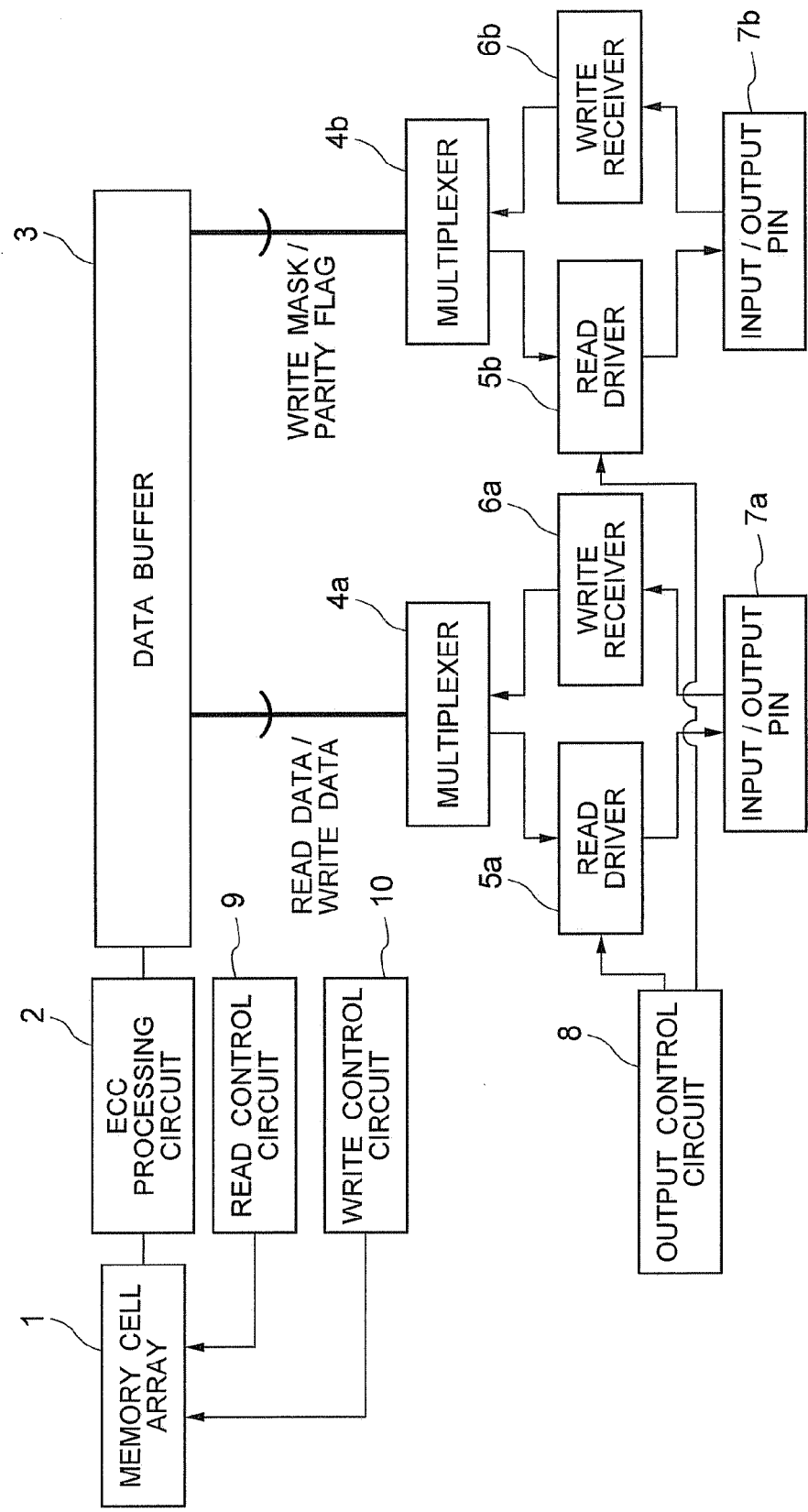
FIG. 3 is a block diagram illustrating an example of the configuration of a nonvolatile semiconductor memory according to the first embodiment.

FIG. 2 illustrates an example of the configuration of a memory system 1000 according to a first embodiment. FIG. 3 is a block diagram illustrating an example of the configuration of a nonvolatile semiconductor memory according to the first embodiment.

As illustrated in FIG. 2, the memory system 1000 includes a nonvolatile semiconductor memory 100 having a DDR interface and an external control circuit 101 that controls the operations of the nonvolatile semiconductor memory 100.

The nonvolatile semiconductor memory 100 is, for example, a nonvolatile RAM such as a FERAM and an MRAM.

The nonvolatile semiconductor memory 100 includes a memory cell array 1, an ECC processing circuit 2, a data buffer 3, a first multiplexer 4a, a second multiplexer 4b, a first read driver 5a, a second read driver 5b, a first write receiver 6a, a second write receiver 6b, a first input/output pin 7a, a second input/output pin 7b, an output control circuit 8, a read control circuit 9, and a write control circuit 10.

The memory cell array 1 has a plurality of memory cells for storing data.

The ECC processing circuit 2 receives read data from the memory cell array 1.

In the case where an error is detected in the read data, the ECC processing circuit 2 outputs the error-corrected read data to the data buffer 3 and outputs a first parity flag to the data buffer 3. The first parity flag indicates that the read data has been error-corrected.

In the case where an error is not detected in the read data, the ECC processing circuit 2 outputs the read data to the data buffer 3 without error correction and outputs a second parity flag to the data buffer 3. The second parity flag indicates that the read data has not been error-corrected.

The data buffer 3 stores read data that is outputted from the ECC processing circuit 2 and is equivalent to one-page length of the memory cell array 1, and parity flags corresponding to the read data.

The first multiplexer 4a outputs the read data outputted from the data buffer 3, to the first read driver 5a during reading.

The first multiplexer 4a outputs write data outputted from the first write receiver 6a, to the data buffer 3 during writing of write data inputted from the external control circuit 101.

The second multiplexer 4b outputs the first or second parity flag outputted from the data buffer 3, to the second read driver 5b during reading.

The second multiplexer 4b outputs a write mask signal outputted from the second write receiver 6b, to the data buffer 3 during writing of the write data inputted from the external control circuit 101.

The first read driver 5a outputs, to the first input/output pin 7a, the read data inputted from the data buffer 3 through the first multiplexer 4a.

The second read driver 5b outputs, to the second input/output pin 7b, the first or second parity flag inputted from the data buffer 3 through the second multiplexer 4b.

The first write receiver 6a receives write data inputted from the first input/output pin 7a and outputs the data to the data buffer 3 through the second multiplexer 4b.

The second write receiver 6b receives the write mask signal inputted from the second input/output pin 7b and outputs the signal to the data buffer 3 through the second multiplexer 4b.

The first input/output pin 7a is a pin for outputting the read data outputted from the data buffer 3.

As described above, the second input/output pin 7b is a pin for inputting the write mask signal during writing of the write data inputted from the external control circuit 101. When the read data is outputted, the second input/output pin 7b is used for outputting the first or second parity flag outputted from the data buffer 3.

Thus, the nonvolatile semiconductor memory 100 does not require an additional input/output pin for outputting the first or second parity flag.

The output control circuit 8 controls the outputs of the first and second read driver 5a and 5b.

For example, during reading, the output control circuit 8 sets the output of the first read driver 5a at a high impedance in a period during which the first read driver 5a does not output the read data.

Moreover, the output control circuit 8 sets, during reading, the output of the second read driver 5b at a high impedance in a period during which the second read driver 5b does not output the first or second parity flag.

The read control circuit 9 controls a reading operation of the memory cell array 1 in response to commands including a read command.

The write control circuit 10 controls a writing operation of the memory cell array 1 in response to commands, for example, data and a write command based on read commands inputted from the external control circuit 101, The following will describe an example of a reading operation of the nonvolatile semiconductor memory 100 configured thus, in the DDR-SDRAM standard.

First, the case where read data contains an error will be discussed below.

Figure 4:
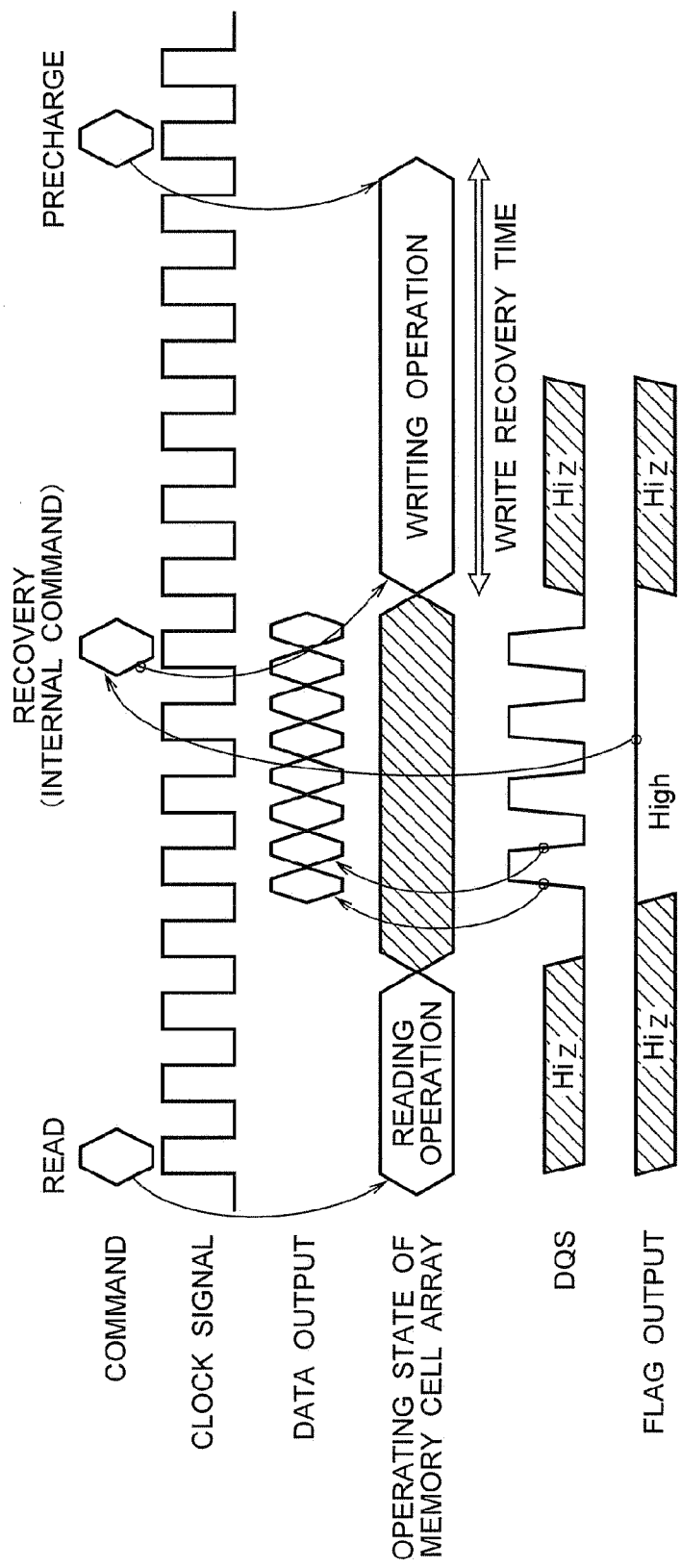
FIG. 4 is a waveform chart showing an example of access timing during reading of the nonvolatile semiconductor memory 100 illustrated in FIG. 3, in the case where read data contains an error.

FIG. 4 is a waveform chart showing an example of access timing during reading of the nonvolatile semiconductor memory 100 illustrated in FIG. 3, in the case where read data contains an error.

As shown in FIG. 4, first, a reading operation is performed based on the read command. Specifically, the read control circuit 9 controls the memory cell array 1 to read the data of a memory cell for each prefetch (data path length).

Then, the ECC processing circuit 2 detects an error of the read data, outputs the error-corrected read data to the data buffer 3, and then outputs, to the data buffer 3, the first parity flag indicating that the read data has been error-corrected.

The data buffer 3 stores the read data of the memory cell array 1 and the parity flag corresponding to the read data having been outputted from the ECC processing circuit 2.

Then, the nonvolatile semiconductor memory 100 outputs the error-corrected read data stored in the data buffer 3 from the first input/output pin 7a to the external control circuit 101 in synchronization with the data strobe signal DQS.

At this point, the nonvolatile semiconductor memory 100 outputs the first parity flag (in this case, a "High" level signal), which corresponds to the error-corrected read data, from the second input/output pin 7b to the external control circuit 101 in synchronization with the error-corrected read data outputted from the first input/output pin 7a to the external control circuit 101.

Thus, the external control circuit 101 can obtain information on the error-corrected read data (error detection).

As has been discussed, the first parity flag is outputted using the pin for inputting the write mask signal. Hence, the first parity flag can be outputted without an increase in the number of the input/output pins of the nonvolatile semiconductor memory 100.

The output control circuit 8 sets the output of the second read driver 5b at a high impedance in a period during which the second read driver 5b does not output the first parity flag.

Then, the nonvolatile semiconductor memory 100 internally issues the recovery command (internal command) in response to the first parity flag, and rewrites, into the memory cell array 1, the error-corrected read data stored in the data buffer 3.

After that, the nonvolatile semiconductor memory 100 rewrites the read data based on the recovery command and then precharges the memory cell array 1 based on a precharge command that is inputted from the external control circuit 101 in response to the first parity flag.

The precharge command may be added to the read command and the write command time in the read command time and the write command time, and then the memory cell array 1 may be precharged based on the precharge command.

The following will describe the case where read data contains no errors.

Figure 5:
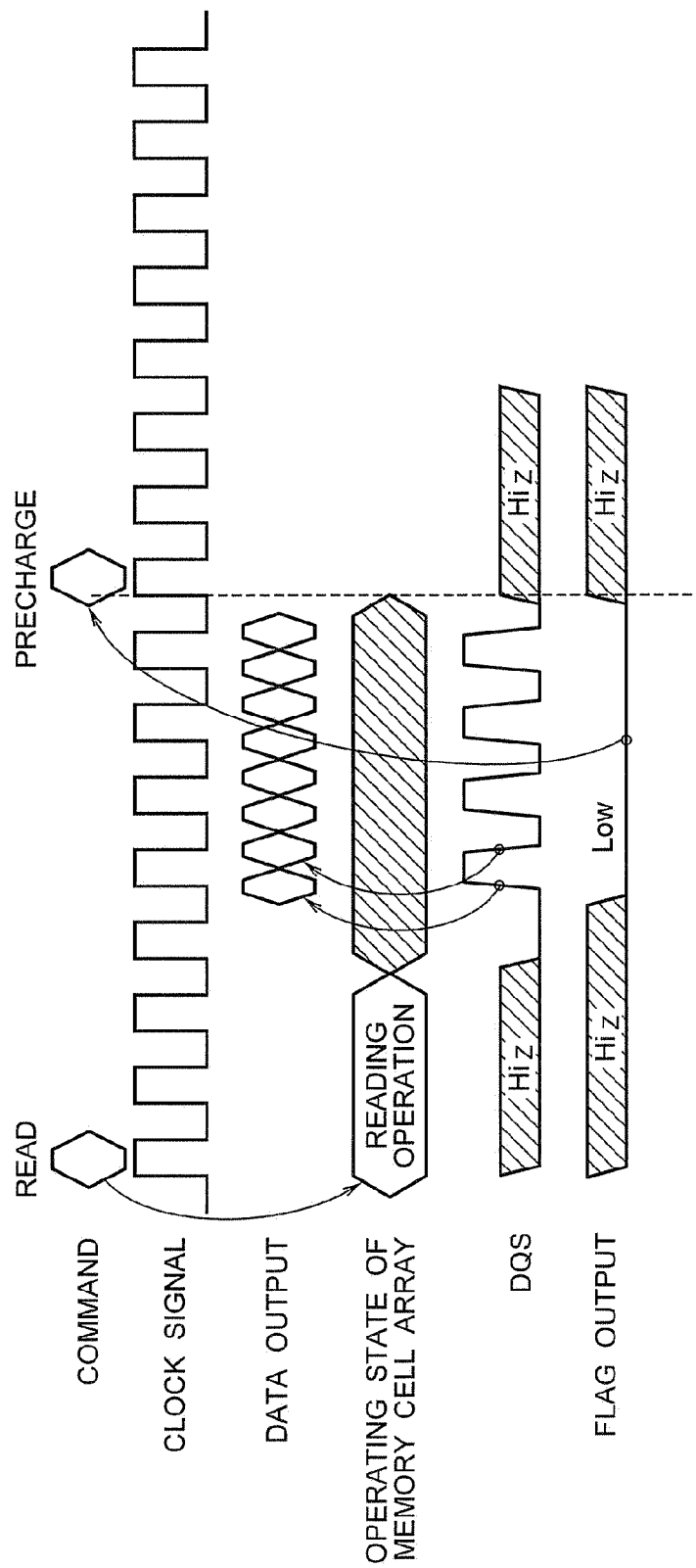
FIG. 5 is a waveform chart showing an example of access timing during reading of the nonvolatile semiconductor memory 100 illustrated in FIG. 3, in the case where read data contains no errors.

FIG. 5 is a waveform chart showing an example of access timing during reading of the nonvolatile semiconductor memory 100 illustrated in FIG. 3, in the case where read data contains no errors.

As shown in FIG. 5, first, a reading operation is performed based on the read command. Specifically, the read control circuit 9 controls the memory cell array 1 to read the data of a memory cell for each prefetch.

The ECC processing circuit 2 having not detected an error of the read data outputs the read data to the data buffer 3 without error correction. Then, the ECC processing circuit 2 outputs the second parity flag indicating that the read data has not been error-corrected, to the data buffer 3.

The data buffer 3 stores the read data of the memory cell array 1 and the parity flags corresponding to the read data having been outputted from the ECC processing circuit 2.

Then, the nonvolatile semiconductor memory 100 outputs the read data that is stored in the data buffer 3 without being error-corrected, from the first input/output pin 7a to the external control circuit 101 in synchronization with the data strobe signal DQS.

At this point, the nonvolatile semiconductor memory 100 outputs the second parity flag (in this case, a "Low" level signal), which corresponds to the read data having not been error-corrected, from the second input/output pin 7b to the external control circuit 101 in synchronization with the read data outputted from the first input/output pin 7a.

Thus, the external control circuit 101 can obtain information on the read data having not been error-corrected (no error has been detected).

As has been discussed, the second parity flag is outputted using the pin for inputting the write mask signal. Hence, the second parity flag can be outputted without an increase in the number of the input/output pins of the nonvolatile semiconductor memory 100.

The output control circuit 8 sets the output of the second read driver 5b at a high impedance in a period during which the second read driver 5b does not output the second parity flag.

Then, the nonvolatile semiconductor memory 100 precharges the memory cell array based on the precharge command inputted from the external control circuit 101 in response to the second parity flag.

In the case where the read data contains no errors and does not have to be rewritten, the nonvolatile semiconductor memory 100 precharges the memory cell array without setting a write recovery time.

Thus, the access performance of the nonvolatile semiconductor memory 100 can be improved.

The precharge command may be automatically generated in the nonvolatile semiconductor memory after the read data is outputted from the first input/output pin 7a.

As described above, the nonvolatile semiconductor memory according to the first embodiment can achieve higher access performance.

(Second Embodiment)

In the first embodiment, in the case where an error is detected, error-corrected read data for each prefetch (data path length) stored in the data buffer 3 is immediately rewritten into the memory cell array 1.

In a second embodiment, in the case where an error is detected, error-corrected read data for each page length stored in a data buffer 3 is, for example, collectively rewritten for each page length into a memory cell array 1.

Figure 6:
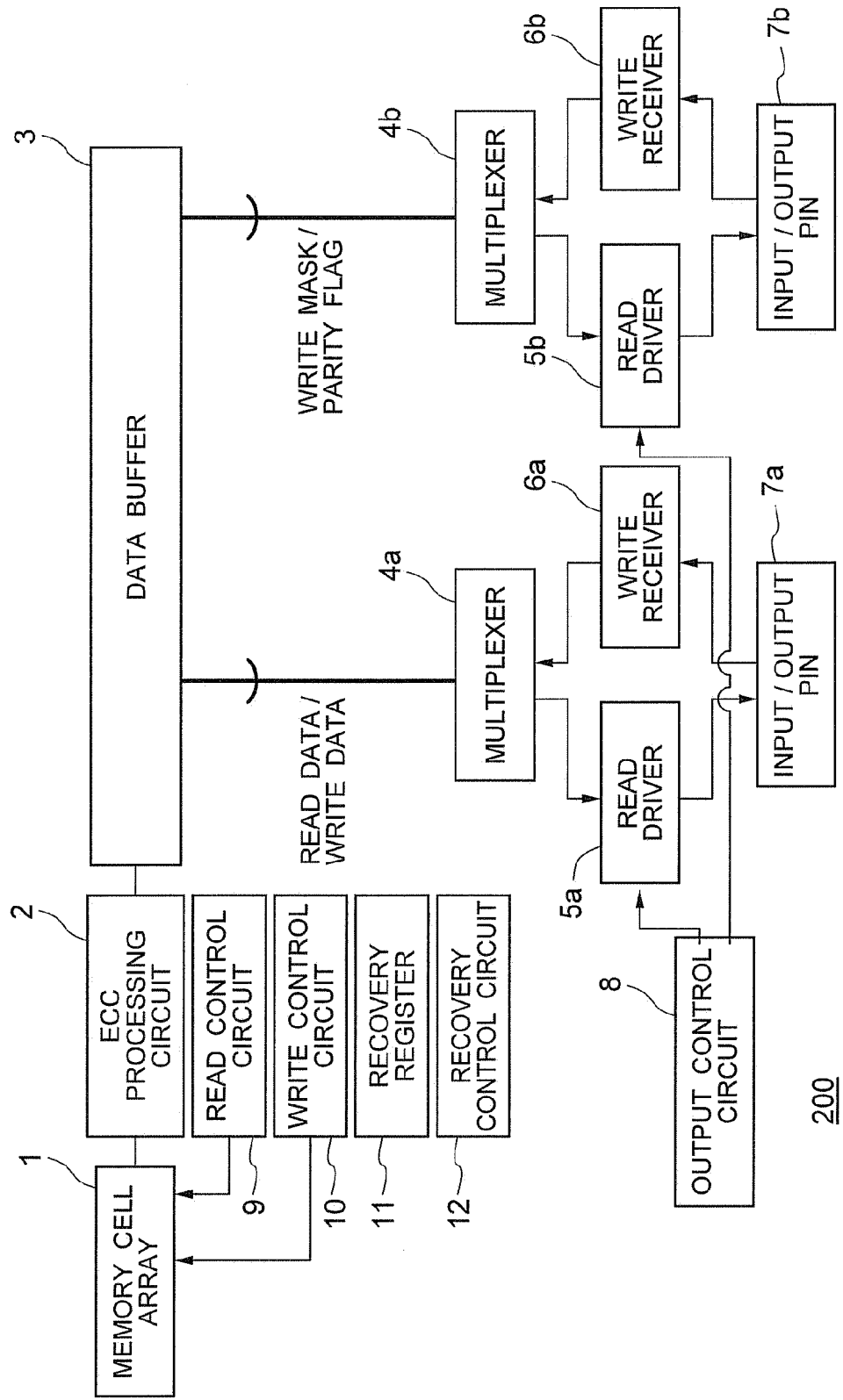
FIG. 6 is a block diagram illustrating an example of the configuration of a nonvolatile semiconductor memory 200 according to the second embodiment.

FIG. 6 is a block diagram illustrating an example of the configuration of a nonvolatile semiconductor memory 200 according to the second embodiment. In FIG. 6, the same reference numerals as in FIG. 2 indicate the same configurations as in the first embodiment. The nonvolatile semiconductor memory 200 in FIG. 6 is applied to the memory system 1000 in FIG. 1 like the nonvolatile semiconductor memory 100 of the first embodiment.

As illustrated in FIG. 6, the nonvolatile semiconductor memory 200 further includes a recovery register 11 and a recovery control circuit 12 unlike in the nonvolatile semiconductor memory 100 of the first embodiment.

The recovery register 11 stores the addresses of pieces of read data having been corrected by an ECC processing circuit 2 and a first parity flag corresponding to the pieces of read data.

The recovery control circuit 12 controls an operation of the recovery register 11 based on a recovery command inputted from an external control circuit 101.

Other configurations of the nonvolatile semiconductor memory 200 are identical to those of the nonvolatile semiconductor memory 100 according to the first embodiment.

The following will describe an example of a reading operation of the nonvolatile semiconductor memory 200 configured thus, in the DDR-SDRAM standard.

First, the case where read data contains an error will be discussed below.

Figure 7:
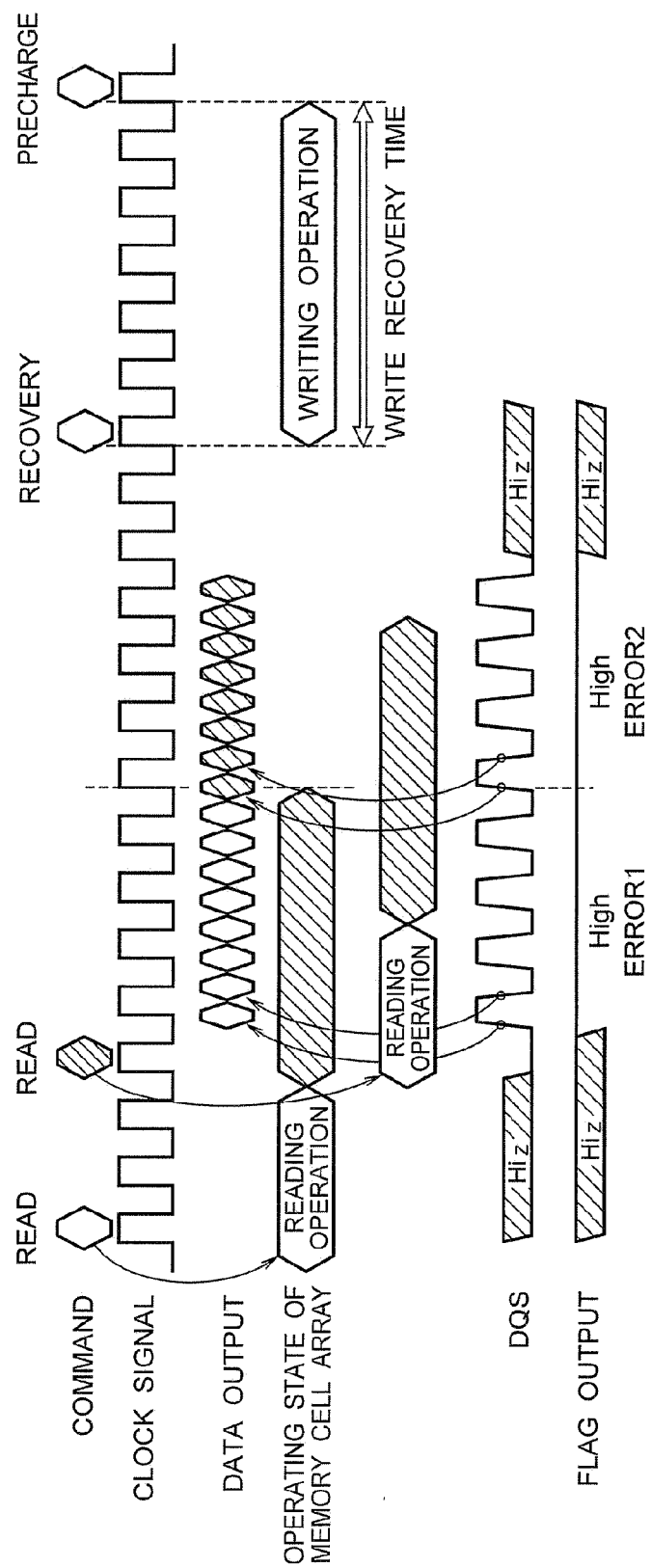
FIG. 7 is a waveform chart showing an example of access timing during reading of the nonvolatile semiconductor memory illustrated in FIG. 6, in the case where read data contains an error.

FIG. 7 is a waveform chart showing an example of access timing during reading of the nonvolatile semiconductor memory illustrated in FIG. 6, in the case where read data contains an error.

As shown in FIG. 7, first, reading operations are sequentially performed in response to (two) sequentially inputted read commands. Specifically, a read control circuit 9 controls the memory cell array 1 to read the data of a memory cell for each prefetch (data path length).

Then, the ECC processing circuit 2 detects an error of the read data, outputs the error-corrected read data to the data buffer 3, and then outputs, to the data buffer 3, the first parity flag indicating that the read data has been error-corrected.

The data buffer 3 stores the read data of the memory cell array 1 and the parity flags corresponding to the read data having been outputted from the ECC processing circuit 2.

Then, the nonvolatile semiconductor memory 200 sequentially outputs the error-corrected read data stored in the data buffer 3 from a first input/output pin 7a to an external control circuit 101 in synchronization with a data strobe signal DQS inputted from the external control circuit 101.

At this point, the nonvolatile semiconductor memory 200 sequentially outputs the first parity flags (in this case, "High" level signals) corresponding to errors (ERROR 1, ERROR 2) corresponding to the error-corrected read data from the second input/output pin 7b to the external control circuit 101 in synchronization with the error-corrected read data outputted from the first input/output pin 7a to the external control circuit 101.

Thus, the external control circuit 101 can obtain, for example, information on the error-corrected read data (error detection) corresponding to two sequentially inputted read commands.

As has been discussed, the first parity flags are outputted using a pin for inputting a write mask signal. Hence, the first parity flags can be outputted without an increase in the number of the input/output pins of the nonvolatile semiconductor memory 200.

An output control circuit 8 sets the output of a second read driver 5b at a high impedance in a period during which the second read driver 5b does not output the first parity flags.

Then, the nonvolatile semiconductor memory 200 rewrites, into the memory cell array 1, the error-corrected read data stored in the data buffer 3.

After that, the nonvolatile semiconductor memory 200 collectively rewrites the read data that is stored in the data buffer 3 and corresponds to the addresses stored in the recovery register 11 and one page of the memory cell array 1, into the memory cell array 1 based on the recovery command inputted from the external control circuit 101 in response to the first parity flag.

After rewriting the read data based on the recovery command, the nonvolatile semiconductor memory 200 precharges the memory cell array 1 based on a precharge command inputted from the external control circuit 101 in response to the first parity flag.

The precharge command may be automatically generated in the nonvolatile semiconductor memory 200 after the rewriting (after a write recovery time), and then the memory cell array 1 may be precharged based on the precharge command.

In this explanation, in the case where an error is detected, error-corrected read data for each page length stored in the data buffer 3 is collectively rewritten into the memory cell array 1 for each page length.

The error-corrected read data stored in the data buffer 3 is stored in the recovery register 11 and thus can be collectively rewritten at random.

Specifically, in the case where an error is detected, the read data stored in the recovery register 11 is collectively rewritten into the memory cell array 1 based on the recovery command, the read-data corresponding to the addresses stored in the recovery register 11.

Thus, the error-corrected read data can be collectively rewritten at random into the memory cell array 1.

In the case of read data containing no errors, the memory cell array 1 is precharged based on the precharge command after the read data is outputted, as in the first embodiment.

Thus, the access performance of the nonvolatile semiconductor memory 200 can be improved as in the first embodiment.

As described above, the nonvolatile semiconductor memory according to the second embodiment can achieve higher access performance.

(Third Embodiment)

A third embodiment will describe a structural example in which a recovery flag is inputted from an external control circuit 101 in response to a first parity flag.

Figure 8:
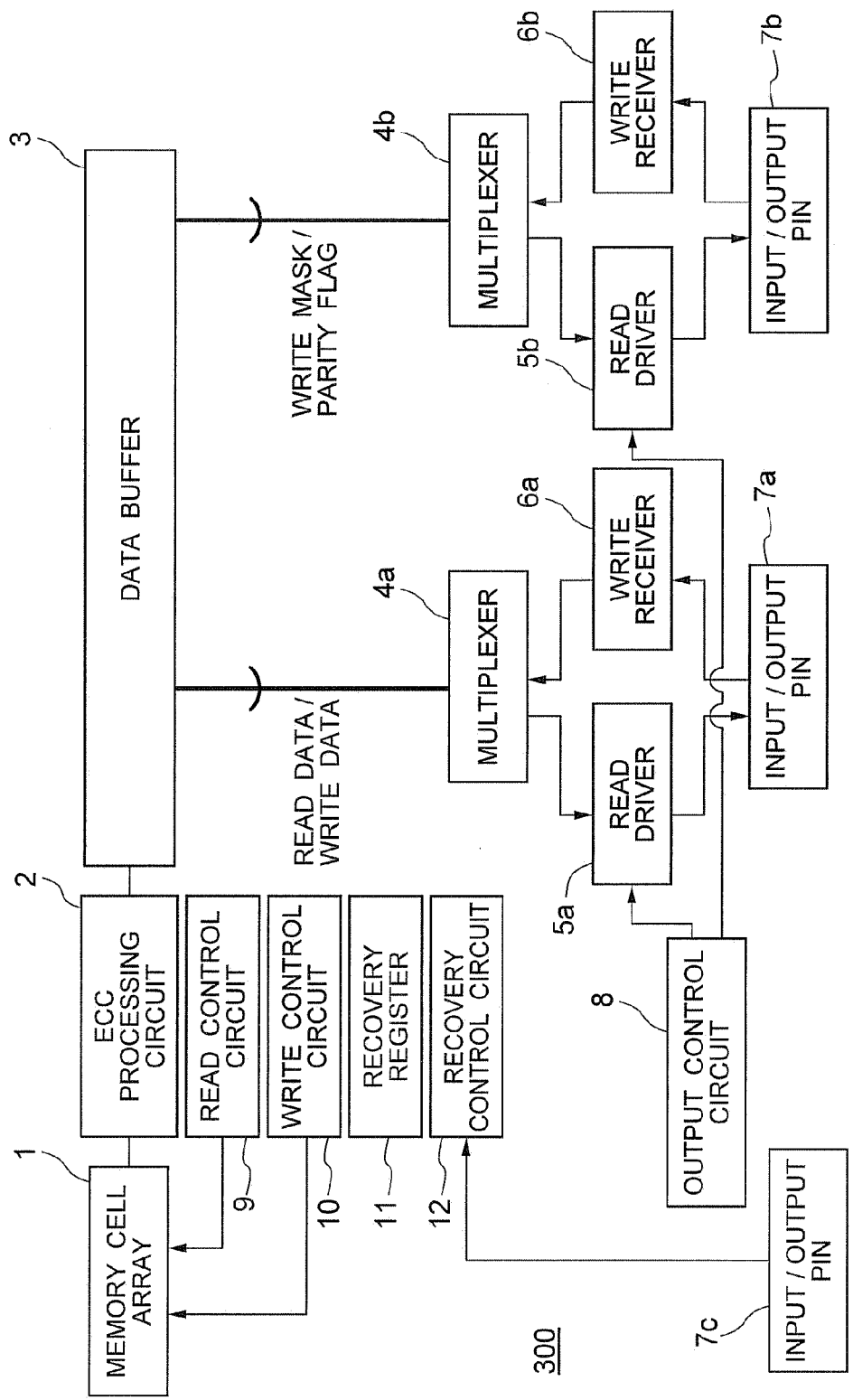
FIG. 8 is a block diagram illustrating an example of the configuration of a nonvolatile semiconductor memory 300 according to the third embodiment.

FIG. 8 is a block diagram illustrating an example of the configuration of a nonvolatile semiconductor memory 300 according to the third embodiment. In FIG. 8, the same reference numerals as in FIG. 6 indicate the same configurations as in the second embodiment. The nonvolatile semiconductor memory 300 in FIG. 8 is applied to the memory system 1000 in FIG. 2 like the nonvolatile semiconductor memory 100 of the first embodiment.

As illustrated in FIG. 8, the nonvolatile semiconductor memory 300 further includes a third input/output pin 7c unlike the nonvolatile semiconductor memory 200 of the second embodiment.

The third input/output pin 7c receives a recovery flag from the external control circuit 101 in response to the first parity flag outputted from a second input/output pin 7b.

A recovery control circuit 12 controls an operation of a recovery register 11 based on a recovery command inputted from the external control circuit 101, through the third input/output pin 7c.

The following will describe an example of a reading operation of the nonvolatile semiconductor memory 300 configured thus, in the DDR-SDRAM standard.

First, the case where read data contains an error will be discussed below.

Figure 9:
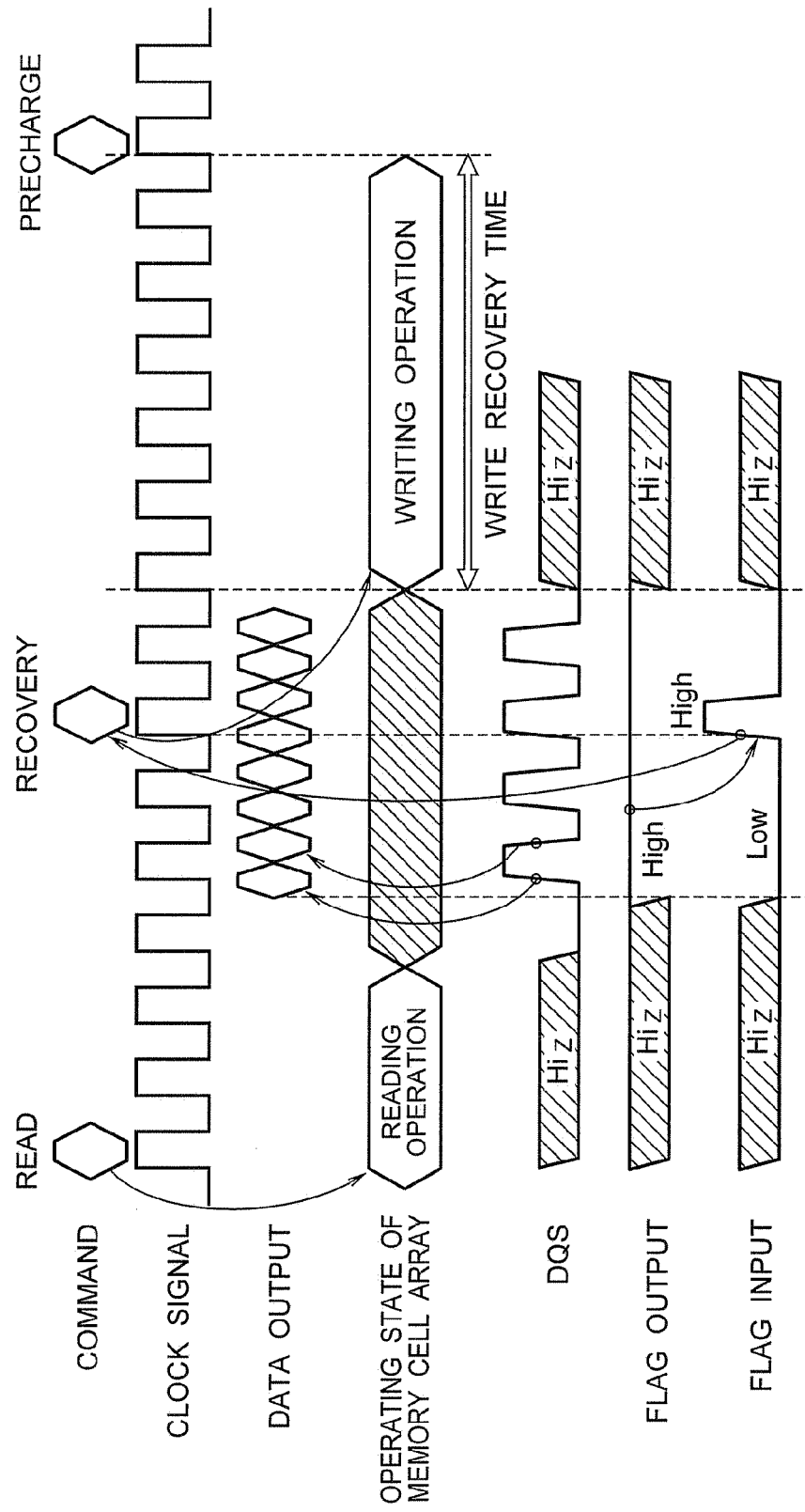
FIG. 9 is a waveform chart showing an example of access timing during reading of the nonvolatile semiconductor memory 300 illustrated in FIG. 8, in the case where read data contains an error.

FIG. 9 is a waveform chart showing an example of access timing during reading of the nonvolatile semiconductor memory 300 illustrated in FIG. 8, in the case where read data contains an error.

As shown in FIG. 9, first, a reading operation is performed based on a read command. Specifically, a read control circuit 9 controls a memory cell array 1 to read the data of a memory cell for each prefetch (data path length).

An ECC processing circuit 2 detects an error of the read data, outputs the error-corrected read data to a data buffer 3, and then outputs, to the data buffer 3, the first parity flag indicating that the read data has been error-corrected.

The data buffer 3 stores the read data of the memory cell array 1 and the parity flag corresponding to the read data having been outputted from the ECC processing circuit 2.

Then, the nonvolatile semiconductor memory 300 outputs the error-corrected read data stored in the data buffer 3 from a first input/output pin 7a to the external control circuit 101 in response to a data strobe signal DQS inputted from the external control circuit 101.

At this point, the nonvolatile semiconductor memory 300 outputs the first parity flag (in this case, a "High" level signal) corresponding to the error-corrected read data from the second input/output pin 7b to the external control circuit 101 in synchronization with the error-corrected read data outputted from the first input/output pin 7a to the external control circuit 101.

Thus, the external control circuit 101 can obtain information on the error-corrected read data (error detection).

While the read data is outputted, a recovery flag (in this case, a "High" level signal) outputted from the external control circuit 101 in response to the first parity flag is inputted to the recovery control circuit 12 through the third input/output pin 7c. The recovery control circuit 12 issues the recovery command in response to the recovery flag.

Then, the nonvolatile semiconductor memory 300 rewrites, into the memory cell array 1, the error-corrected read data stored in the data buffer 3 based on the recovery command.

After rewriting the read data based on the recovery command, the nonvolatile semiconductor memory 300 precharges the memory cell array 1 based on a precharge command inputted from the external control circuit 101 in response to the first parity flag.

The precharge command may be automatically generated in the nonvolatile semiconductor memory 300 after the rewriting (after a write recovery time), and then the memory cell array 1 may be precharged based on the precharge command.

The following will describe the case where read data contains no errors.

Figure 10:
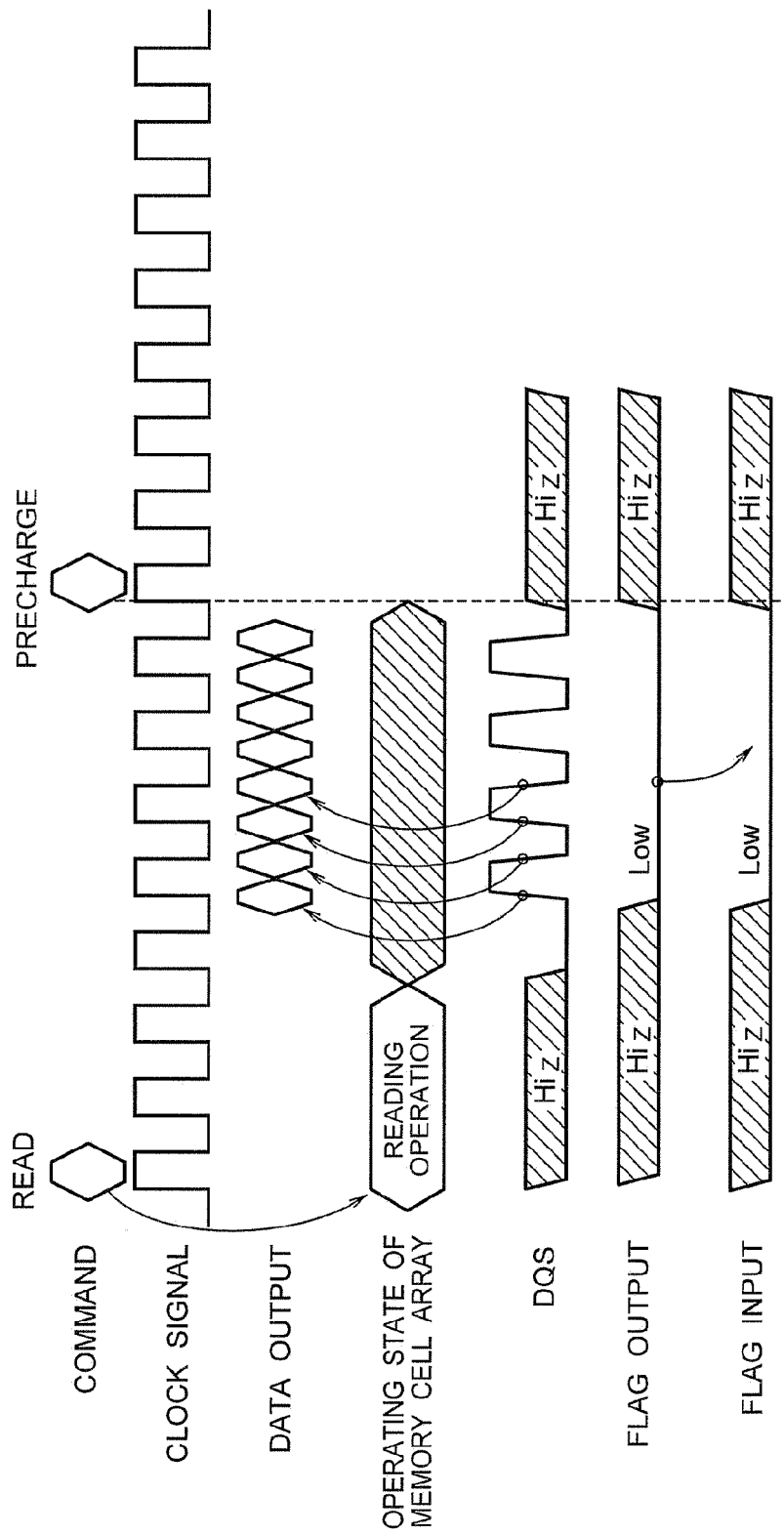
FIG. 10 is a waveform chart showing an example of access timing during reading of the nonvolatile semiconductor memory 300 illustrated in FIG. 8, in the case where read data contains no errors.

FIG. 10 is a waveform chart showing an example of access timing during reading of the nonvolatile semiconductor memory 300 illustrated in FIG. 8, in the case where read data contains no errors.

As shown in FIG. 10, first, a reading operation is performed based on the read command. Specifically, the read control circuit 9 controls the memory cell array 1 to read the data of a memory cell for each prefetch.

The ECC processing circuit 2 having not detected an error of the read data outputs the read data to the data buffer 3 without error correction. Then, the ECC processing circuit 2 outputs a second parity flag indicating that the read data has not been error-corrected, to the data buffer 3.

The data buffer 3 stores the read data of the memory cell array 1 and the parity flag corresponding to the read data outputted from the ECC processing circuit 2.

Then, the nonvolatile semiconductor memory 300 outputs the read data stored in the data buffer 3 without being error-corrected, from the first input/output pin 7a to the external control circuit 101 in response to the data strobe signal DQS inputted from the external control circuit 101.

At this point, the nonvolatile semiconductor memory 300 outputs a second parity flag (in this case, a "Low" level signal), which corresponds to the read data having not been error-corrected, from the second input/output pin 7b to the external control circuit 101 in synchronization with the read data outputted from the first input/output pin 7a.

Thus, the external control circuit 101 can obtain information on the read data having not been error-corrected (no error has been detected).

Since rewriting is not necessary, the external control circuit 101 does not output the recovery flag while the read data is outputted (in this case, a signal inputted to the third input/output pin 7c is kept at "Low" level).

Furthermore, the nonvolatile semiconductor memory 300 precharges the memory cell array based on the precharge command inputted from the external control circuit 101 in response to the second parity flag.

As described above, in the case where read data contains no errors and does not have to be rewritten, the nonvolatile semiconductor memory 300 precharges the memory cell array without setting a write recovery time.

Thus, the access performance of the nonvolatile semiconductor memory 100 can be improved.

The precharge command may be automatically generated in the nonvolatile semiconductor memory after the read data is outputted from the first input/output pin 7a.

In this explanation, the single read command is issued. Even in the case where multiple read commands are sequentially issued as in the second embodiment, the recovery flag is inputted in a similar manner.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
   a memory cell array having a plurality of memory cells for storing data;
   an ECC (Error Check and Correction) processing circuit configured to receive read data from the memory cells, the ECC processing circuit configured to output, in the case where an error is detected in the read data, the error-corrected read data and a first parity flag indicating that the read data has been error-corrected, and further configured to output, in the case where an error is not detected in the read data, the read data without correcting the error and a second parity flag indicating that the read data has not been error-corrected;
   a data buffer configured to store the read data and the parity flags outputted from the ECC processing circuit;
   a first input/output pin configured to output the read data outputted from the data buffer; and
   a second input/output pin configured to output the first or second parity flag outputted from the data buffer,
   wherein the ECC processing circuit is configured to output the first parity flag corresponding to the error-corrected read data from the second input/output pin in synchronization with the error-corrected read data in the data buffer outputted from the first input/output pin.

2. The nonvolatile semiconductor memory according to claim 1, wherein the error-corrected read data is rewritten into the memory cell array based on a recovery command corresponding to the first parity flag.

3. The nonvolatile semiconductor memory according to claim 2, wherein the memory cell array is configured to be precharged based on a precharge command after the read data is rewritten based on the recovery command.

4. The nonvolatile semiconductor memory according to claim 1, wherein the ECC processing circuit is configured to output the second parity flag corresponding to the read data having not been error-corrected from the second input/output pin in synchronization with the read data in the data buffer without being error-corrected outputted from the first input/output pin.

5. The nonvolatile semiconductor memory according to claim 4, wherein the memory cell array is configured to be precharged based on a precharge command corresponding to the second parity flag.

6. The nonvolatile semiconductor memory according to claim 1, further comprising a recovery register configured to store addresses of multiple pieces of read data corrected by the ECC processing circuit and the first parity flag.

7. The nonvolatile semiconductor memory according to claim 6, wherein the ECC is configured to collectively rewrite read data of the memory cell array into the memory cell array, the read data corresponding to the addresses stored in the recovery register and being stored in the data buffer.

8. The nonvolatile semiconductor memory according to claim 6, wherein the recovery register is further configured to store the corrected read data.

9. The nonvolatile semiconductor memory according to claim 8, wherein the ECC is configured to collectively rewrite read data that corresponds to the addresses stored in the recovery register and is stored in the recovery register into the memory cell array.

10. The nonvolatile semiconductor memory according to claim 8, further comprising a third input/output pin that is configured to receive the recovery flag from outside in response to the first parity flag outputted from the second input/output pin,
    wherein the ECC is configured to collectively rewrite read data that corresponds to the addresses stored in the recovery register and is stored in the recovery register into the memory cell array based on a recovery command corresponding to the recovery flag.

11. A memory system comprising:
    a nonvolatile semiconductor memory; and
    an external control circuit configured to control operations of the nonvolatile semiconductor memory,
    wherein the nonvolatile semiconductor memory comprises:
    a memory cell array having a plurality of memory cells for storing data;
    an ECC (Error Check and Correction) processing circuit configured to receive read data from the memory cells, the ECC processing circuit configured to output, in the case where an error is detected in the read data, the error-corrected read data and a first parity flag indicating that the read data has been error-corrected, and further configured to output, in the case where an error is not detected in the read data, the read data without correcting the error and a second parity flag indicating that the read data has not been error-corrected;

a data buffer configured to store the read data and the parity flags outputted from the ECC processing circuit;

a first input/output pin configured to output the read data outputted from the data buffer; and a second input/output pin configured to output the first or second parity flag outputted from the data buffer, wherein the ECC is configured to output the first parity flag corresponding to the error-corrected read data from the second input/output pin to the external control circuit in synchronization with the error-corrected read data in the data buffer outputted from the first input/output pin to the external control circuit.

12. The memory system according to claim 11, wherein the ECC is configured to rewrite the error-corrected read data into the memory cell array based on a recovery command corresponding to the first parity flag.

13. The memory system according to claim 12, wherein the memory cell array is precharged based on a precharge command after the read data is rewritten based on the recovery command.

14. The memory system according to claim 11, wherein the ECC is configured to output the second parity flag corresponding to the read data having not been error-corrected from the second input/output pin in synchronization with the read data in the data buffer without being error-corrected outputted from the first input/output pin.

15. The memory system according to claim 14, wherein the memory cell array is configured to be precharged based on a precharge command corresponding to the second parity flag.

16. The memory system according to claim 11, wherein the nonvolatile semiconductor memory further comprises a recovery register configured to store addresses of multiple pieces of read data corrected by the ECC processing circuit and the first parity flag.

17. The memory system according to claim 16, wherein the ECC is configured to collectively rewrite the read data of the memory cell array into the memory cell array, the read data corresponding to the addresses stored in the recovery register and being stored in the data buffer.

18. The memory system according to claim 16, wherein the recovery register is further configured to store the corrected read data.

19. The memory system according to claim 18, wherein the ECC is configured to collectively rewrite the read data that corresponds to the addresses stored in the recovery register and is stored in the recovery register into the memory cell array.

20. The memory system according to claim 18, wherein the nonvolatile semiconductor memory further comprises a third input/output pin configured to receive the recovery flag from outside in response to the first parity flag outputted from the second input/output pin, wherein the ECC is configured to collectively rewrite the read data that corresponds to the addresses stored in the recovery register and is stored in the recovery register into the memory cell array based on a recovery command corresponding to the recovery flag.

* * * * *